(12) United States Patent
Satoh et al.

(10) Patent No.: US 8,890,108 B2
(45) Date of Patent: Nov. 18, 2014

(54) MEMORY DEVICE HAVING VERTICAL SELECTION TRANSISTORS WITH SHARED CHANNEL STRUCTURE AND METHOD FOR MAKING THE SAME

(75) Inventors: Kimihiro Satoh, Beaverton, OR (US); Yiming Huai, Pleasanton, CA (US); Jing Zhang, Los Altos, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 13/438,845

(22) Filed: Apr. 4, 2012

(65) Prior Publication Data

US 2013/0126819 A1 May 23, 2013

Related U.S. Application Data

(60) Provisional application No. 61/562,309, filed on Nov. 21, 2011.

(51) Int. Cl.
| | |
|---|---|
| *H01L 29/02* | (2006.01) |
| *H01L 47/00* | (2006.01) |
| *H01L 29/04* | (2006.01) |
| *H01L 29/06* | (2006.01) |
| *H01L 47/02* | (2006.01) |
| *H01L 45/00* | (2006.01) |
| *H01L 27/24* | (2006.01) |

(52) U.S. Cl.
CPC ............... *H01L 45/06* (2013.01); *H01L 45/08* (2013.01); *H01L 45/1233* (2013.01); *H01L 45/144* (2013.01); *H01L 45/146* (2013.01); *H01L 45/147* (2013.01); *H01L 45/16* (2013.01); *H01L 27/2436* (2013.01); *H01L 27/2463* (2013.01)

USPC ............... 257/4; 257/1; 257/2; 257/3; 257/5; 257/6

(58) Field of Classification Search
USPC .................... 257/302, 303, 329–332
See application file for complete search history.

(56) References Cited

U.S. PATENT DOCUMENTS

| | | | |
|---|---|---|---|
| 5,155,059 A | 10/1992 | Hieda | |
| 6,114,725 A | 9/2000 | Furukawa et al. | |
| 6,337,497 B1 * | 1/2002 | Hanafi et al. | ........... 257/306 |
| 6,788,573 B2 | 9/2004 | Choi | |

(Continued)

OTHER PUBLICATIONS

U.S. Appl. No. 13/356,633, Satoh et al.

*Primary Examiner* — Steven Loke
*Assistant Examiner* — Juanita B Rhodes
(74) *Attorney, Agent, or Firm* — Bing K. Yen; G. Marlin Knight

(57) ABSTRACT

The present invention relates to resistive memory devices incorporating therein vertical selection transistors and methods for making the same. A memory device comprises a semiconductor substrate having a first type conductivity and a plurality of parallel trenches therein; a plurality of parallel common source lines having a second type conductivity opposite to the first type conductivity formed in the trench bottoms; a plurality of parallel gate electrodes formed on the trench sidewalls with a gate dielectric layer interposed therebetween, the gate electrodes being lower in height than the trench sidewalls; and a plurality of drain regions having the second type conductivity formed in top regions of the trench sidewalls, at least two of the drain regions being formed in each of the trench sidewalls and sharing a respective common channel formed in the each of the trench sidewalls and a respective one of the source lines.

15 Claims, 13 Drawing Sheets

(56) References Cited

U.S. PATENT DOCUMENTS

| | | |
|---|---|---|
| 7,009,208 B2* | 3/2006 | Aratani et al. .................. 257/74 |
| 7,149,108 B2* | 12/2006 | Rinerson et al. .............. 365/163 |
| 8,319,275 B2 | 11/2012 | Shim et al. |
| 2005/0001257 A1* | 1/2005 | Schloesser et al. ........... 257/302 |
| 2006/0013042 A1* | 1/2006 | Forbes et al. ............ 365/185.08 |
| 2006/0261404 A1* | 11/2006 | Forbes .......................... 257/324 |
| 2009/0127586 A1* | 5/2009 | Gruening-von Schwerin ...................... 257/205 |

\* cited by examiner

MEMORY DEVICE HAVING VERTICAL SELECTION TRANSISTORS WITH SHARED CHANNEL STRUCTURE AND METHOD FOR MAKING THE SAME

RELATED APPLICATIONS

The present application is related to U.S. provisional patent application Ser. No. 61/562,309, filed Nov. 21, 2011, for MEMORY DEVICE INCLUDING TRANSISTOR ARRAY SHARING COMMON CHANNEL AND PROCESS FOR MAKING THE SAME, by SATOH et al., included by reference herein and for which benefit of the priority date is hereby claimed. The present application is a continuation-in-part of U.S. patent application bearing Ser. No. 13/356,633 and having a filing date of Jan. 23, 2012.

FIELD OF THE INVENTION

The present invention relates to Field Effect Transistors (FET), particularly to selection transistors in memory devices.

BACKGROUND OF THE INVENTION

Resistive memory is a new class of non-volatile memory, which can retain the stored information when powered off. A resistive memory device normally comprises an array of memory cells, each of which includes at least a resistive memory element and a selection element coupled in series between appropriate electrodes. Upon application of an appropriate voltage or current to the resistive memory element, the electrical resistance of the resistive memory element would change accordingly, thereby switching the stored logic in the respective memory cell.

A resistive memory element can be classified into at least one of several known groups based on its resistively switching mechanism. The resistive memory element of Phase Change Random Access Memory (PCRAM) may comprise a phase change chalcogenide compound, which can switch between a resistive amorphous phase and a conductive crystalline phase. The resistive memory element of Conductive Bridging Random Access Memory (CBRAM) relies on the statistical bridging of metal rich precipitates therein for its switching mechanism. The resistive memory element of CBRAM normally comprises a nominally insulating metal oxide material, which can switch to a lower electrical resistance state as the metal rich precipitates grow and link to form conductive paths upon application of an appropriate voltage. The resistive memory element of Magnetoresistive Random Access Memory (MRAM) typically comprises at least two layers of different ferromagnetic materials with a non-magnetic spacer layer interposed therebetween. When a switching pulse is applied to the memory element of a MRAM device, one of the ferromagnetic layers will switch its magnetic field polarity, thereby changing the element's electrical resistance.

A selection element in a memory cell functions like a switch to direct current through the selected memory element coupled thereto. One common selection element is diode, which can reverse bias a non-selected memory cell. While a selection diode has a simple structure that can minimize the cell size of the resistive memory cell, a memory architecture employing the selection diode normally has a slower random access time. Another commonly used selection element is transistor, which allows for faster selection of memory cells and therefore faster random access time. While a memory device employing the selection transistor is more suitable for the random access type of memories, the more complicated structure of the selection transistor means the size of the memory cell will be larger, which translates to a lower cell density.

FIG. 1 is a perspective view of a conventional resistive memory device comprising a silicon substrate 80, a plurality of memory cells 82 formed therein, a plurality of parallel gate electrodes 84 connecting the cells 82 in a first direction, a plurality of parallel source lines 86 connecting the cells 82 in the first direction, and a plurality of bit lines 88 connecting the cells 82 in a second direction substantially perpendicular to the first direction. Each of the memory cells 82 includes a respective one of a plurality of resistive memory elements 90 and a respective one of a plurality of conventional selection transistors 92 connected in series by way of a respective one of a plurality of contacts 94. The channels of the selection transistors 92 beneath the gate electrodes 84 have a length of 1 F and a width of 1 F, where F denotes the minimum feature size or one half the minimum feature pitch normally associated with a particular lithography process. In memory applications where memory cells are arranged in dense and repetitive patterns, photolithography is more constrained by the pitch of the feature pattern rather than the feature size itself. This is because the feature size can be modulated by photo lithography process conditions, such as exposure and resist development, but shrinkage of the feature pitch would require shorter wavelength light source and/or significant improvement in optics. In reality, the scaling of the device size in a dense array, such as that in memory applications, is limited by the minimum feature pitch of 2 F. Moreover, it is normally assumed that the minimum feature size is half of the corresponding minimum pitch. The illustrated conventional resistive memory device in FIG. 1 has cell dimensions of 4 F and 2 F in the directions of bit lines 88 and source lines 86, respectively, resulting in a cell size of 8 $F^2$. As would be understood by one of ordinary skill in the art, the minimum pitch between two repetitive features on a same mask layer is 2 F. Accordingly, the minimum size of a memory cell would be 4 $F^2$ when arranged in a square array using conventional lithography.

To be cost competitive, a small memory cell size is desired in order to increase device density. One way to achieve this is to simply shrink the feature size, F. However, several difficulties can arise when scaling the size of the conventional transistors 92 illustrated in FIG. 1, particularly its channel length, to sizes of a few tens of nanometers. As the channel length is reduced, there is a propensity for the formation of parasitic conduction paths between source and drain, thereby causing punch through current leakages. Another obstacle encountered in shrinking the conventional transistors 92 is reduced current drivability caused by the reduced width of the current carrying channel. This is a significant issue for resistive memory devices, which require higher current to switch their memory state.

Another way to reduce the memory cell size is to use a different architecture that would permit the memory cell size to scale down to the minimum size of 4 $F^2$ while increasing the channel width and length to mitigate the above mentioned problems associated with shrinking feature size. With the source, drain, and channel of the selection transistor lie on a same plane, the conventional resistive memory cell size as illustrated in FIG. 1 is limited to 8 $F^2$. Moreover, the corresponding channel width and length of the conventional selection transistor would both be 1 F.

SUMMARY OF THE INVENTION

The present invention overcomes the current drivability and punch through current leakage issues associated with the conventional selection transistor while reducing the memory cell size to 4 $F^2$ by using a novel memory cell design that includes an array of vertical selection transistors sharing a common channel.

Accordingly, an object of the present invention is to provide a novel resistive memory device having an array of vertical selection transistors sharing a common channel.

Another object of the present invention is to provide a method for making a novel resistive memory device having an array of vertical selection transistors sharing a common channel.

Therefore, according to one aspect of the present invention, a memory device comprises a semiconductor substrate having a first type conductivity and a plurality of parallel trenches therein, each of the trenches having a respective one of a plurality of trench bottoms and a respective pair of a plurality of trench sidewalls and being isolated from respective adjacent trenches by trench isolation regions; a plurality of parallel common source lines having a second type conductivity opposite to the first type conductivity, each of the source lines being formed in a respective one of the trench bottoms; a plurality of parallel gate electrodes formed on the trench sidewalls with a gate dielectric layer interposed therebetween, the gate electrodes being lower in height than the trench sidewalls; a plurality of drain regions having the second type conductivity formed in top regions of the trench sidewalls, at least two of the drain regions being formed in each of the trench sidewalls and sharing a respective common channel formed in the each of the trench sidewalls and a respective one of the source lines; a plurality of contact studs disposed on top of the drain regions; a plurality of resistive memory elements disposed on top of the contact studs; and a plurality of parallel bit lines disposed on top of the resistive memory elements with each of the bit lines connecting a respective row of the resistive memory elements along a direction perpendicular to the source lines.

According to another aspect of the present invention, a method for fabricating a memory device comprises the steps of providing a semiconductor substrate having a first type conductivity and a pad layer thereon; forming a plurality of parallel trench isolation regions through the pad layer in the substrate; removing the pad layer to partially expose the parallel trench isolation regions; forming a hard mask self-aligned to the parallel trench isolation regions; forming a plurality of parallel trenches in between the trench isolation regions by selectively etching the substrate having the hard mask thereon, each of the trenches having a respective one of a plurality of trench bottoms and a respective pair of a plurality of trench sidewalls; conformally forming a gate dielectric layer over the trenches; forming a plurality of gate electrodes on the trench sidewalls with the gate dielectric interposed therebetween; forming a plurality of parallel source lines in the trench bottoms by ion implantation, the source lines having a second type conductivity opposite to the first type provided in the substrate; forming an interlayer dielectric layer by filling and covering the trenches; forming a plurality of contact holes through the interlayer dielectric layer, the contact holes being aligned to top of the trench sidewalls; forming a plurality of drain regions in the trench sidewalls by ion implantation through the contact holes, the drain regions having the second type conductivity; forming a plurality of contact studs on the drain regions by filling the contact holes with a conductive material; forming a plurality of resistive memory elements on the contact studs; and forming a plurality of parallel bit lines connecting respective rows of the memory elements along a direction perpendicular to the source lines.

The objects, features, aspects, and advantages of the present invention are readily apparent from the following detailed description of the preferred embodiments for carrying out the invention when taken in connection with the accompanying drawings.

BRIEF DESCRIPTION OF THE DRAWINGS

For purposes of clarity and brevity, like elements and components will bear the same designations and numbering throughout the Figures, which are not necessarily drawn to scale.

DETAILED DESCRIPTION OF THE INVENTION

Figure 1:
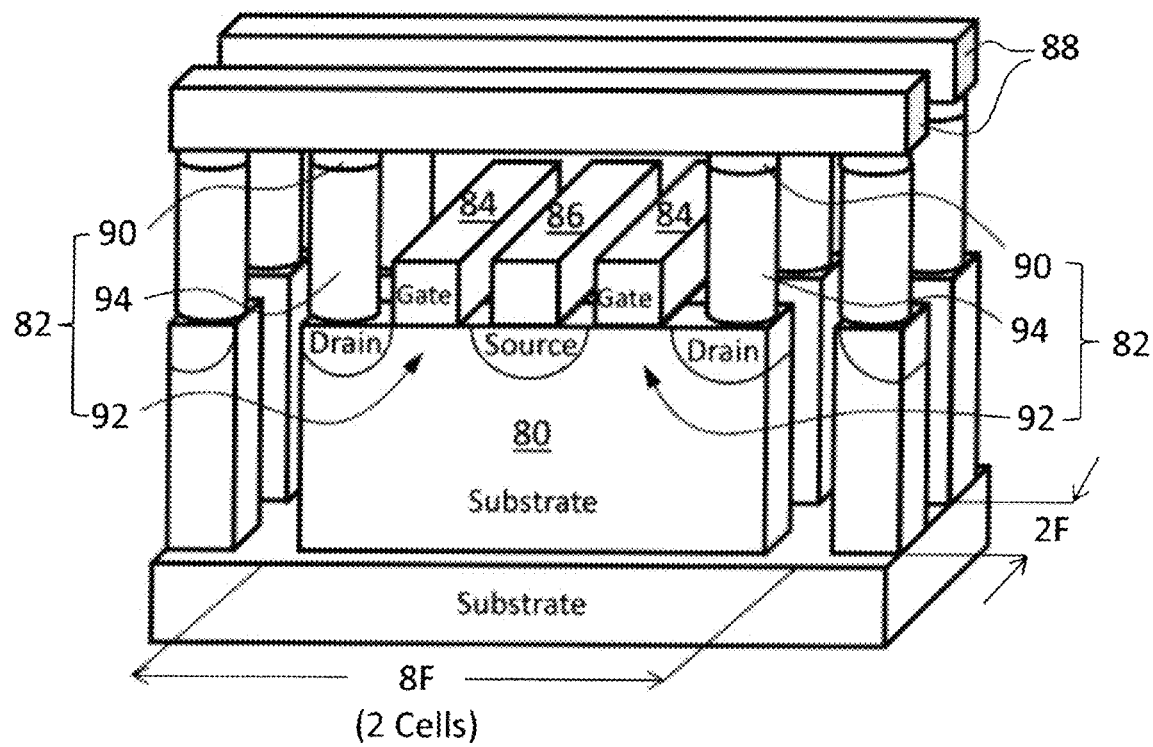
FIG. 1 is a perspective view illustrating a conventional resistive memory device with conventional selection transistors.

The present invention overcomes the current drivability and punch through current leakage issues associated with the conventional selection transistor as the feature size shrinks Moreover, the present invention also reduces the resistive memory cell size to 4 $F^2$ by using a novel cell design that includes a plurality of vertical selection transistors sharing a common channel.

An embodiment of the present invention as applied to a resistive memory device having an array of memory cells will now be described with reference to FIG. 2. In this drawing the insulation material separating various elements is omitted for reasons of clarity. The illustrated memory device 100 comprises a semiconductor substrate 102 having a first type conductivity and a plurality of parallel trenches 104 therein, each of the trenches 104 having a respective one of a plurality of trench bottoms 106 and a respective pair of a plurality of trench sidewalls 108 and being isolated from respective adjacent trenches by trench isolation regions 110; a plurality of parallel common source lines 112 having a second type conductivity opposite to the first type conductivity formed in the trench bottoms 106; a plurality of parallel gate electrodes 114 formed on the trench sidewalls 108 with a gate dielectric layer 116 interposed therebetween, the gate electrodes 114 being lower in height than the trench sidewalls 108; a plurality of drain regions 118 having the second type conductivity formed in top regions of the trench sidewalls 108, at least two of the drain regions 118 being formed in each of the trench sidewalls 108 and sharing a respective one of a plurality of common channels 120 formed in the each of the trench sidewalls 108 and a respective one of the source lines 112; a plurality of contact studs 122, each of which being disposed on top of a respective one of the drain regions 118; a plurality of resistive memory elements 124, each of which being disposed on top of a respective one of the contact studs 122; and a plurality of parallel bit lines 126 disposed on top of the memory elements 124 with each of the bit lines 126 connecting a respective row of the resistive memory elements 124 along a direction perpendicular to the source lines 112.

Figure 2:
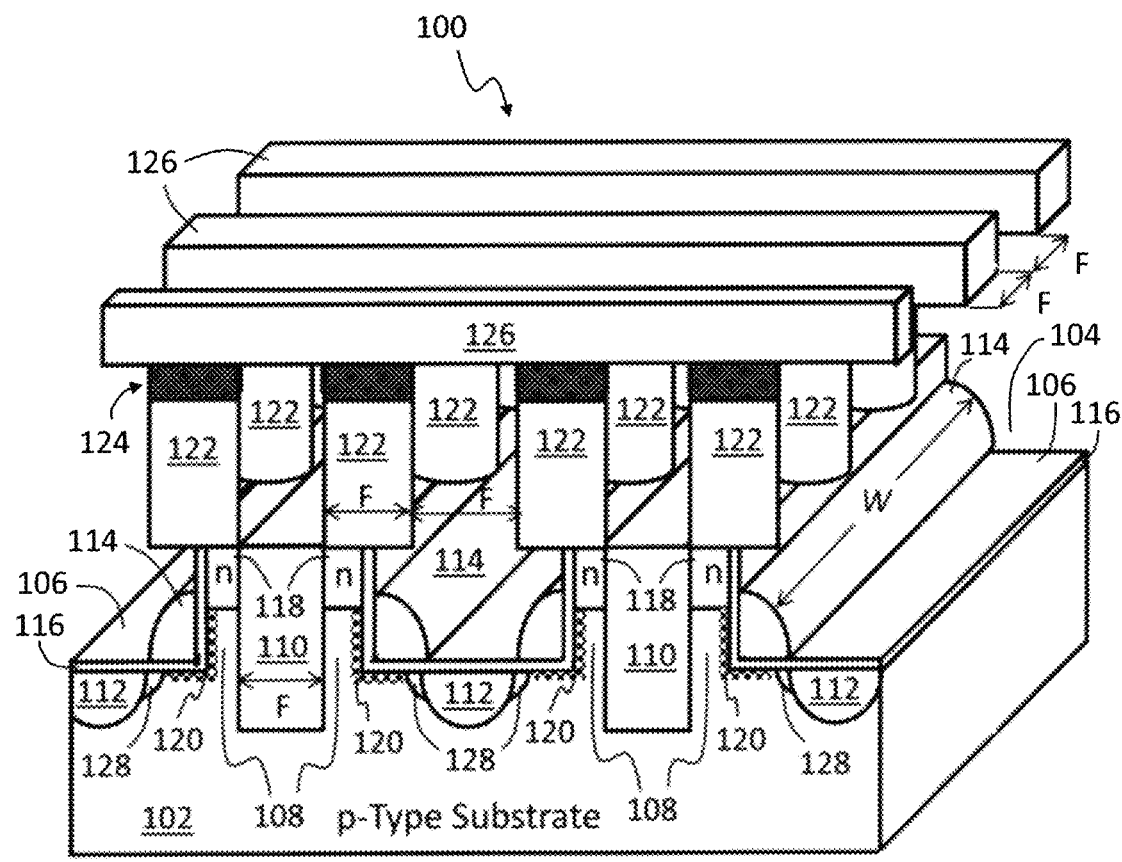
FIG. 2 is a perspective view of the present invention as applied to a memory device having a plurality of selection transistors sharing a common vertical channel.

With continuing reference to FIG. 2, when an appropriate voltage is applied to one of the gate electrodes 114, an electric field is induced across the gate dielectric layer 116 to modulate the conductance of a respective one of the common channels 120 formed in a respective one of the vertical trench sidewalls 108, thereby allowing charge carriers to pass therethrough. Each of the common channels 120 is coupled to a respective one of the source lines 112 and to a respective row of the drain regions 118 formed in top region of a respective one of the sidewalls 108. The common channels 120 having a channel width of W are continuous and extend along the width direction without any isolation feature, such as Shallow Trench Isolation (STI) or LOCal Oxidation of Silicon (LOCOS). As such, the width of the common channels 120 increases with increasing number in a row of the drain regions 118 coupled to each of the common channels 120 and can be significantly wider than the width of a conventional transistor channel. Moreover, comparing with the conventional transistor channel length of approximately 1 F, the length of the common channels 120 may exceed 5 F by increasing the height of the trench sidewalls 108 accordingly.

Although the memory device 100 does not use STI or LOCOS to isolate two adjacent drain regions sharing a same gate electrode like a conventional transistor array, the possible current leakage between the two adjacent drain regions is equivalent to the punch through current, which is 5 to 6 orders smaller than the operation current. Moreover, the significantly wider common channels 120 permit a lower operation voltage, which further reduces the potential current leakage.

The substrate 102 can be any semiconductor substrate known in the art, such as silicon (Si), silicon germanium (SiGe), silicon carbide (SiC), SiCGe, II-VI compounds, III-V compounds, or semiconducting epitaxial layers over such substrates. According to an embodiment of the present invention, the substrate 102 comprises silicon. According to another embodiment of the present invention, the substrate 102 has the p-type conductivity, thereby forming selection transistors with the n-type channel.

Each of the plurality of parallel trenches 104, which may be formed by etching into the substrate 102, has a respective one of the trench bottoms 106 and a respective pair of the trench sidewalls 108. The plurality of parallel common source lines 112 having the second type conductivity are formed in the trench bottoms 106. Each of the source lines 112 is shared by a respective two of the common channels 120 and two respective rows of the drain regions 118 coupled thereto. In some embodiments where the substrate 102 has the p-type conductivity, the source lines 112 having the n-type conductivity may be formed by ion implantation into the trench bottoms 106 with any suitable dopant, such as phosphorous, arsenic, or antimony. According to another embodiment of the present invention, a plurality of pairs of lightly doped regions 128 having a lower dopant concentration than the source lines 112 are formed adjacent thereto and beneath respective pairs of the gate electrodes 128, thereby lowering electric field in respective pairs of the common channels 120 in the vicinity of the source lines 112.

The drain regions 118 having the second type conductivity are formed in top portion of the trench sidewalls 108. In the direction of the source lines 112, the drain regions 118 are separated by regions having the first type conductivity. In the direction of the bit lines 126, which is perpendicular to that of the sources lines 112, two adjacent rows of the drain regions 118 from a respective adjacent two of the trenches 104 are separated by a respective one of the trench isolation regions 110. The bottom of the drain regions 118 is preferably positioned below top of the gate electrodes 114. In some embodiments where the substrate 102 has the p-type conductivity for forming selection transistors with the n-type channel, the drain regions 118 having the n-type conductivity may be formed by ion implantation into the top portion of the trench sidewalls 108 with any suitable dopant, such as phosphorous, arsenic, or antimony.

The gate dielectric layer 116 functions like an insulator medium of a capacitor device. When a voltage is applied to one of the gate electrodes 114, an electric field is induced across the gate dielectric layer 116 to modulate the conductance of a respective one of the common channels 120 on the opposite side. The gate dielectric layer 116 lining the trench sidewalls 108 preferably has a thickness of between 0.5-5 nm and may comprise any material with sufficiently high dielectric constant, including but not limited to $SiO_x$, $SiO_xN_y$, hafnium oxide ($HfO_x$), hafnium oxynitride ($HfO_xN_y$), hafnium silicate ($HfSiO_x$), $HfSiO_xN_y$, zirconium oxide ($ZrO_x$), zirconium oxynitride ($ZrO_xN_y$), zirconium silicate ($ZrSiO_x$), $ZrSiO_xN_y$, aluminum oxide ($AlO_x$), or combinations thereof. The gate dielectric layer 116 may be formed by thermal oxidation of the trench sidewalls 108 or by any suitable thin film deposition method, such as CVD or ALD. In some embodiments where the substrate 102 and the trench sidewalls 108 are formed of silicon, the gate dielectric layer 116 is preferably $SiO_x$ formed by thermal oxidation of the trench sidewalls 108. In another embodiment, the gate dielectric layer 116 is formed of a compound comprising hafnium and oxygen, such as $HfO_x$ or $HfSiO_x$.

The gate electrodes 114 are formed on the trench sidewalls 108 with the gate dielectric layer 116 interposed therebetween. The height of the gate electrodes 114, which defines the length of the common channels 120, is lower than the height of the trench sidewalls 108. When an appropriate voltage is applied to one of the gate electrodes 114, an electric field is induced across the gate dielectric layer 116 to modulate the conductance of a respective one of the common channels 120 formed in a respective one of the vertical trench sidewalls 108, thereby allowing charge carriers to move vertically between a respective one of the source lines 112 and a respective one of the drain regions 118 by way of the respective one of the common channels 120. The gate electrodes 114 may be formed by first depositing one or more layers of conductors on the trench sidewalls 108 using a conformal thin film deposition method, such as Chemical Vapor Deposition (CVD) or Atomic Layer Deposition (ALD), and followed by Reactive Ion Etching (RIE) to define the electrode height. The gate electrodes 114 may comprise one or more layers of any suitable conductive material, such as doped polysilicon, tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), or combinations thereof. In an embodiment, the gate electrodes 114 are formed of a material comprising doped polysilicon. In another embodiment, the gate electrodes 114 comprise at least one layer formed of $TiN_x$.

The trench isolation regions 110 electrically isolate each of the trenches 104 and respective active components contained therein from respective adjacent trenches. The trench isolation regions 110 may be formed by a conventional Shallow Trench Isolation (STI) process and may comprise any dielectric material, such as but not limited to silicon oxide ($SiO_x$), silicon nitride ($SiN_x$), or silicon oxynitride ($SiO_xN_y$).

A function of the contact studs 122 is to provide Ohmic contact for the drain regions 118 of the vertical selection transistors, thereby decreasing the contact resistance. Each of the contact studs 122 is disposed on top of a respective one of the drain regions 118. The contact studs 122 may comprise one or more layers of any suitable conductive material, such as tungsten silicide ($WSi_x$), titanium silicide ($TiSi_x$), cobalt silicide (CoSi$_x$), nickel silicide (NiSi$_x$), tantalum nitride (TaN$_x$), titanium nitride (TiN$_x$), tantalum (Ta), tungsten (W), titanium (Ti), palladium (Pd), platinum silicide (PtSi), Indium (In), or combinations thereof. The contact studs 118 may be formed by depositing any suitable conductive material by ALD or CVD into previously formed contact holes and followed by Chemical Mechanical Polishing (CMP) to remove excess material.

Each of the memory elements 124 is disposed on top of a respective one of the contact studs 122. The resistive memory elements 124 may switch their resistance state by any suitable switching mechanism, such as phase change, precipitate bridging, magnetoresistive switching, or combinations thereof. In one embodiment, the resistive memory elements 124 comprise a phase change chalcogenide compound, such as Ge$_2$Sb$_2$Te$_5$ or AgInSbTe, which can switch between a resistive amorphous phase and a conductive crystalline phase. In another embodiment, the resistive memory elements 124 comprise a nominally insulating metal oxide material, such as NiO, TiO$_2$, or Sr(Zr)TiO$_3$, which can switch to a lower electrical resistance state as the metal rich precipitates grow and link to form conductive paths upon application of an appropriate voltage. In yet another embodiment, the resistive memory elements 124 comprise at least two layers of ferromagnetic materials with a non-magnetic spacer layer interposed therebetween. When a switching pulse is applied, one of the ferromagnetic layers will switch its magnetic field polarity, thereby changing the electrical resistance of the memory element.

The parallel bit lines 126 are coupled to respective rows of memory elements 124 in a direction perpendicular to that of the source lines 112 and the gate electrodes 114. The bit lines 126 may comprise any suitable conductive material, such as copper (Cu), tungsten (W), aluminum (Al), silver (Ag), or alloys thereof. The bit lines 116 may be formed by PVD or CVD of the conductive material and then followed by photolithography and dry etch to define the line pattern.

With continuing reference to FIG. 2, in a preferred embodiment, the memory elements 124 of the memory device 100 are arranged in a square array with a pitch of 2 F along both the bit line and source line directions, thereby reducing the memory cell size to the minimum size of 4 F$^2$. The drain regions 118 coupled to the memory elements 124 by way of the contact studs 122 are also arranged to have a pitch of 2 F in the source line direction. The thickness of the trench sidewalls 108 and hence the drain regions 118 is less than 1 F. Each of the trenches 104, including respective two sidewalls 108, has a total width of 3 F. The trench isolation regions 110 which separate two adjacent trenches have a width of approximately 1 F. Accordingly, each memory cell, which includes a respective memory element and a respective selection transistor, has a cell size of 4 F$^2$. The width of the common channels 120 increases with increasing number in a row of the drain regions 118 coupled to each of the common channels 120 and may be significantly wider than the width of a conventional transistor channel. Moreover, comparing with the conventional transistor channel length of approximately 1 F, the length of the common channels 120 may exceed 5 F by increasing the height of the trench sidewalls 108 accordingly. Despite having a smaller cell size compared with the conventional resistive memory device having a 8 F$^2$ cell size, the memory device 100 has a significantly wider and longer channel than the conventional device to mitigate the short channel and current drivability issues associated with scaling down.

It should be noted that in a memory device where multiple wiring lines pass through each memory cell, the design and placement of gate electrodes, source lines, and bit lines connecting the memory cells are critical in attaining the minimum memory cell size. The present approach of forming the gate electrodes 114 on the trench sidewalls 108 enables the memory device 100 to preserve a minimum memory cell size of 4 F$^2$.

Figure 3:
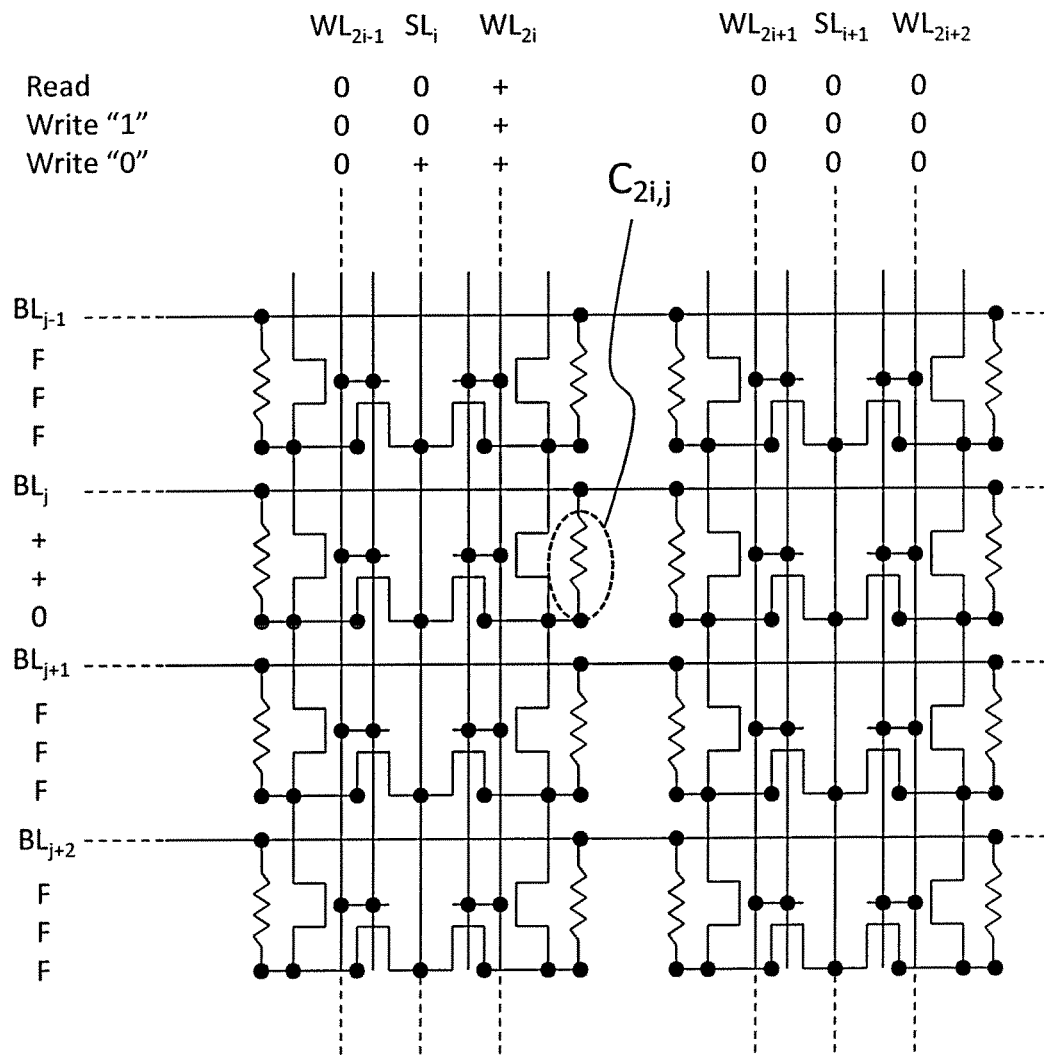
FIG. 3 is a circuit diagram of the memory device illustrated in FIG. 2.

Operation of the memory device 100 having the n-type channel transistors will now be described with reference to a circuit diagram thereof illustrated in FIG. 3. WL, SL, and BL represent gate electrode, source line, and bit line, respectively. FIG. 3 illustrates an exemplary method of using the resistive memory device 100, which may operate in one of three different modes: read, write "0," or write "1." A selected memory cell $C_{2i,j}$ comprising a selection transistor and a memory element coupled thereto for read or write operation is situated at the cross point between a selected bit line $BL_j$ and a selected gate electrode $WL_{2i}$. For read or write operations, a suitable positive voltage is applied to the selected gate electrode $WL_{2i}$, thereby forming a common conductive channel shared by selection transistors connected thereto. For the read mode of operation, a positive voltage $V_1$ is applied to the selected bit line $BL_j$, while the selected source line $SL_i$ is grounded. For the write "1" mode of operation, a positive voltage $V_2$, which is higher than $V_1$, is applied to the selected bit line $BL_j$, while the selected source line $SL_i$ is grounded. For the write "0" mode of operation, the selected bit line $BL_j$ is grounded, while a positive voltage is applied to the selected source line $SL_i$. For all modes of operation, source lines and gate electrodes not selected are grounded, while bit lines not selected are floated.

Figure 4:
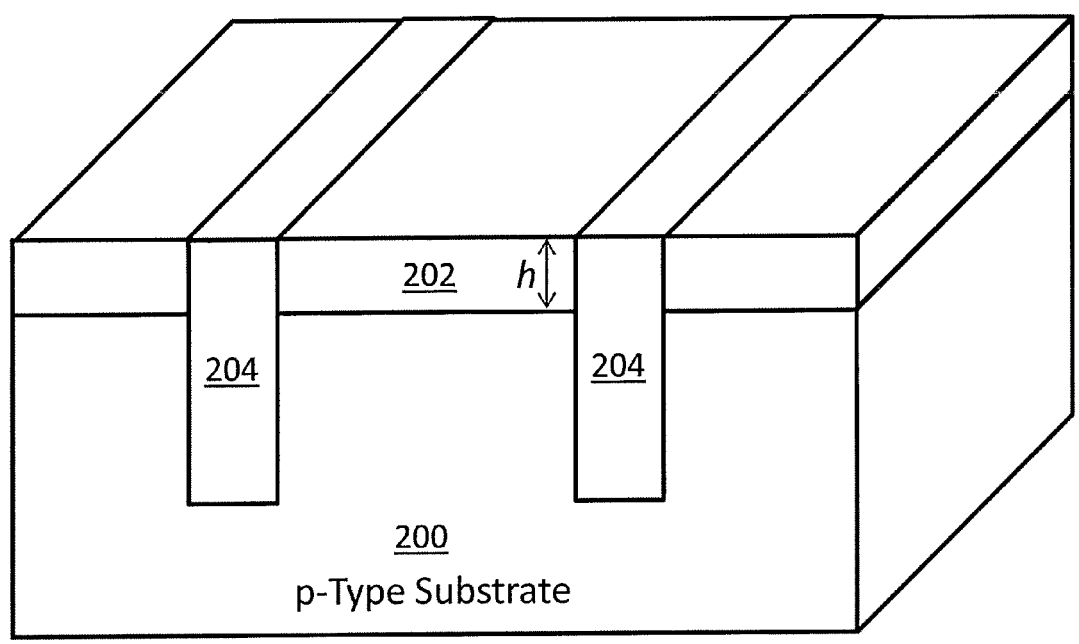
FIGS. 4-13 are perspective views illustrating various stages in formation of a memory device in accordance with one or more embodiments of the present invention.
Figure 5:
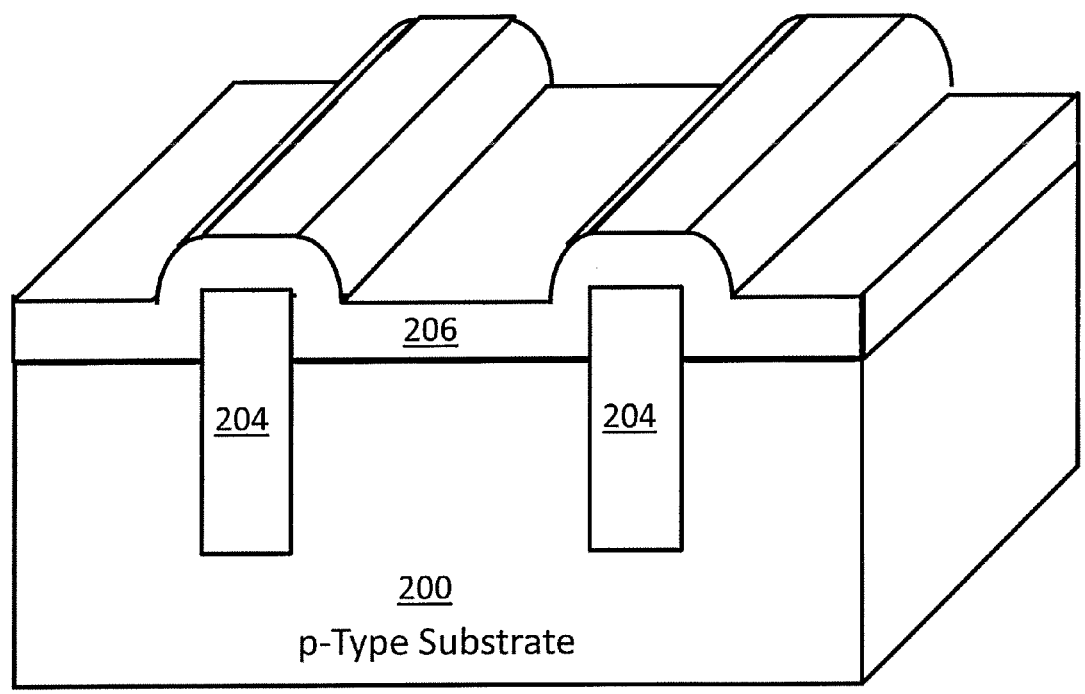

Fabrication of the resistive memory device 100 shown in FIG. 2 will now be described with reference to FIGS. 4-13, which illustrate various intermediate structures of the memory device. Referring now to FIG. 4, the processing starts by providing a semiconductor substrate 200 having a first type conductivity and a pad layer 202 thereon. The substrate 200 can be any semiconductor substrate known in the art, such as Si, SiGe, SiC, SiCGe, II-VI compounds, III-V compounds, or semiconducting epitaxial layers over such substrates. In one embodiment, the semiconductor substrate 200 is formed of silicon. In another embodiment, the first type conductivity provided in the substrate 200 is p type. The pad layer 202 may comprise one or more layers of any suitable wear resistant material that may be used as a CMP stop layer, including oxides, nitrides, oxynitrides, amorphous carbons, or combinations thereof. In one embodiment, the pad layer 202 is formed of silicon nitride. A plurality of parallel trench isolation regions 204 are formed in the substrate 200 through the pad layer 202 by a conventional STI process in a manner as well known to one of skill in the art, resulting in a structure illustrated in FIG. 4. The trench isolation regions 204 may comprise any suitable insulator material, including oxides, nitrides, or combinations thereof. In one embodiment, the trench isolations regions 204 are formed of silicon oxide.

The processing continues by removing the pad layer 202 using a suitable wet etch process to partially expose the trench isolation regions 204, thereby allowing the trench isolations regions 204 to protrude from the substrate surface by a height of h. In some embodiments where the pad layer 202 is formed of silicon nitride, the wet etch process may be carried out using a solution comprising hot phosphoric acid. A hard mask layer 206 is conformally deposited onto the substrate 200, resulting in a structure shown in FIG. 5. The hard mask layer 206 may be deposited by a conformal deposition method, such ALD or CVD, and may comprise any hard mask material which has high etch selectivity to the substrate 200 therebeneath, such as silicon oxide, aluminum oxide, amorphous carbon, boron nitride, or combinations thereof. In some embodiments where the substrate 200 is formed of silicon, the hard mask layer 206 may be formed of a material comprising silicon oxide, aluminum oxide, or boron nitride.

Figure 6:
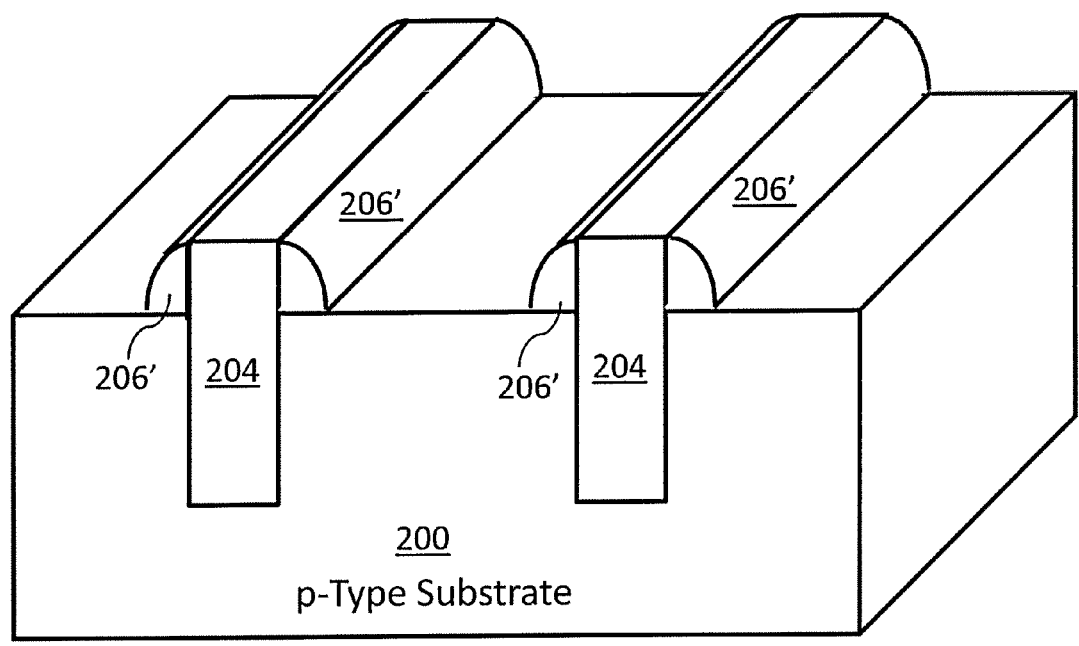

The processing continues by vertically etching the hard mask layer 206, thereby forming a hard mask 206' comprising a plurality of pairs of spacer lines in contiguous contact with the trench isolation regions 204 as illustrated in FIG. 6. The vertical etching process may be carried out by using a Reactive Ion Etch (RIE) process.

Figure 7:
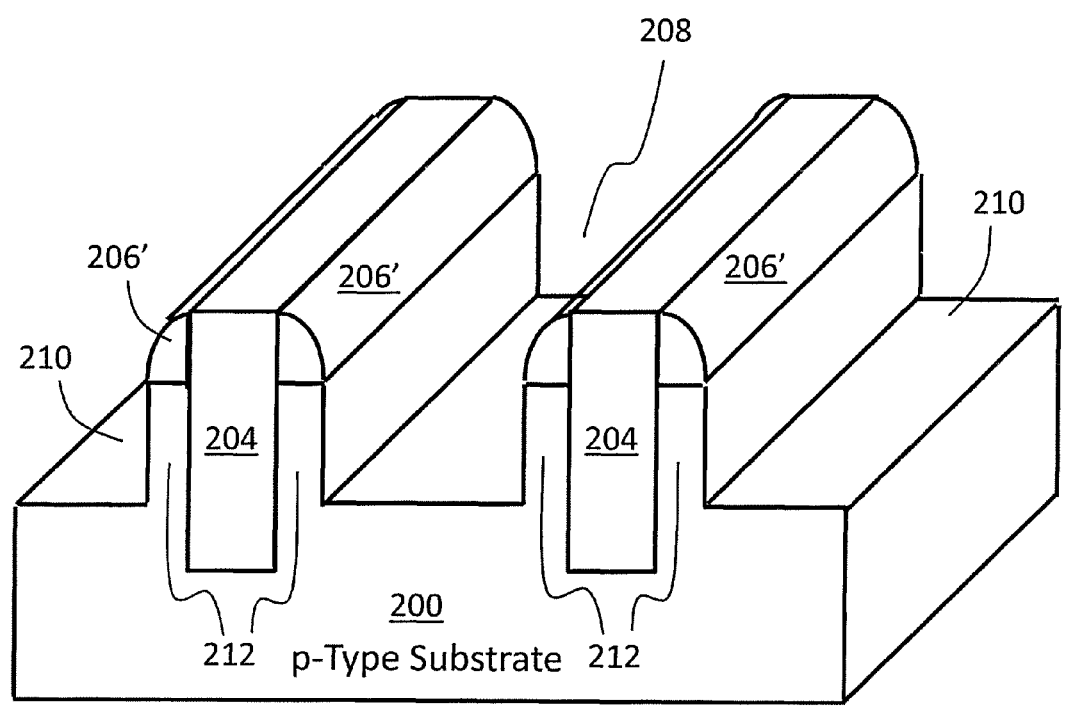

Referring now to FIG. 7, the substrate 200 having the mask 206' thereon is vertically etched to form a plurality of parallel trenches 208, each of which has a respective one of a plurality of trench bottoms 210 and a respective pair of a plurality of trench sidewalls 212. The width the trenches 208 may be controlled by the width of the spacer lines of the hard mask 206', which in turn depends on the thickness of the hard mask layer 206. The height of the trench sidewalls 212, which defines the channel length, is preferably between 1 F and 2 F. The trench bottoms 210 are preferably above the bottom of the trench isolation regions 204. The vertical etch process may be accomplished by using a RIE process. In embodiments where the substrate 200 is formed of silicon, the RIE process may be carried out by using a gas chemistry comprising chlorine and hydrogen bromide (HBr).

Figure 8:
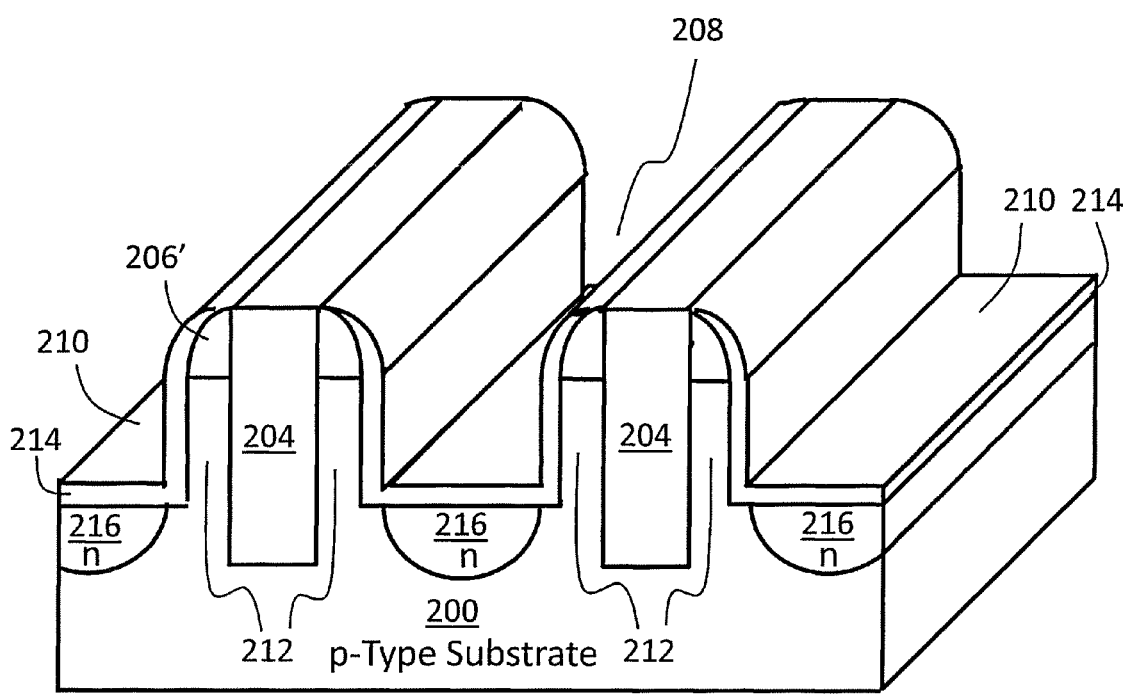

Referring now to FIG. 8, a protective layer 214, which protects the trench sidewalls 212 from the subsequent ion implantation process, is conformally deposited into the trenches 208, covering the bottoms 210 and sidewalls 212. The protective layer 214 may comprise any suitable material, such as oxides, nitrides or a combination thereof, and may be deposited by any suitable conformal deposition method, such as CVD or ALD. Lightly doped regions 216 having a second type conductivity opposite to the first type provided in the substrate 200 are formed in the trench bottoms 210 by ion implantation through the protective layer 214, which protects the trench sidewalls 214 from implanted with dopants. In some embodiments where the first type conductivity provided in the substrate 200 is p type, the lightly doped regions 216 having the opposite n-type conductivity may be formed by ion implantation with any suitable dopant, such as phosphorous, arsenic, or antimony. After the formation of the lightly doped regions 216 in the trench bottoms 210, the protective layer 214 is removed prior to the next processing step.

Figure 9:
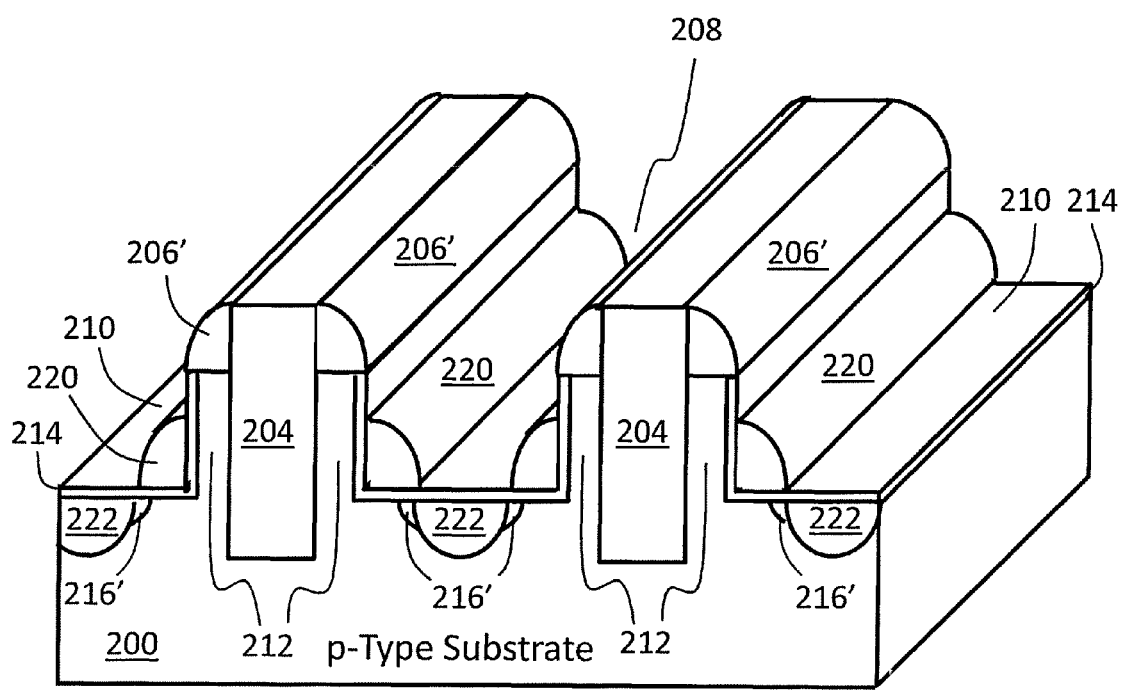

The processing continues by forming a gate dielectric layer 218 over the trench surface as illustrated in FIG. 9. The gate dielectric layer 218 may comprise any suitable material with sufficiently high dielectric constant, including but not limited to $SiO_x$, $SiO_xN_y$, hafnium oxide ($HfO_x$), hafnium oxynitride ($HfO_xN_y$), hafnium silicate ($HfSiO_x$), $HfSiO_xN_y$, zirconium oxide ($ZrO_x$), zirconium oxynitride ($ZrO_xN_y$), zirconium silicate ($ZrSiO_x$), $ZrSiO_xN_y$, aluminum oxide ($AlO_x$), or combinations thereof. The gate dielectric layer 218 may be formed by thermal oxidation of the trench sidewalls 212 and bottoms 210 or by any suitable conformal deposition method, such as CVD or ALD. In some embodiments where the substrate 200 is formed of silicon, the gate dielectric layer 218 is preferably silicon oxide formed by thermal oxidation of the trench sidewalls 212 and bottoms 210. In another embodiment, the gate dielectric layer 218 is formed of a compound comprising hafnium and oxygen, such as $HfO_x$ or $HfSiO_x$.

With continuing reference to FIG. 9, a plurality of gate electrodes 220 are formed on the trench sidewalls 212 with the gate dielectric layer 218 interposed therebetween. The formation of the gate electrodes 220 comprises the steps of conformally depositing a conductive layer over the entire surface and then vertically etching to remove portions of the conductive layer from the trench bottoms 210 and top of the trench isolation regions 204 and the hard mask 206' while leaving most of the conductive layer on the trench sidewalls 212 intact. The height of the gate electrodes 220, which defines the channel length, can be modulated by the vertical etching process and is preferably lower than the height of the trench sidewalls 212. The conductive layer and the gate electrodes 220 formed thereform may comprise one or more layers of any suitable conductive material, such as doped polysilicon, tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), or combinations thereof. In an embodiment, the gate electrodes 220 are formed of a material comprising doped polysilicon. In another embodiment, the gate electrodes 220 comprise at least one layer formed of $TiN_x$. The vertical etching process of the conductive layer may be carried out by using a RIE process.

Following the formation of the gate electrodes 220, a plurality of parallel source lines 222 having a second type conductivity are formed in the trench bottoms 210 between respective pairs of the gate electrodes 220 by ion implantation. Compared with the ion implantation process for the lightly doped regions 216, the ion implantation process for the source lines 222 uses a higher dose, resulting in a higher dopant concentration. Portions of the lightly doped regions 216' beneath the gate electrodes 220 are protected by the gate electrodes 220 from receiving the additional dose of dopant and thus have lower dopant concentrations. In some embodiments where the first type conductivity provided in the substrate 200 is p type, the source lines 222 having the opposite n-type conductivity may be formed by ion implantation with any suitable dopant, such as phosphorous, arsenic, or antimony.

Figure 10:
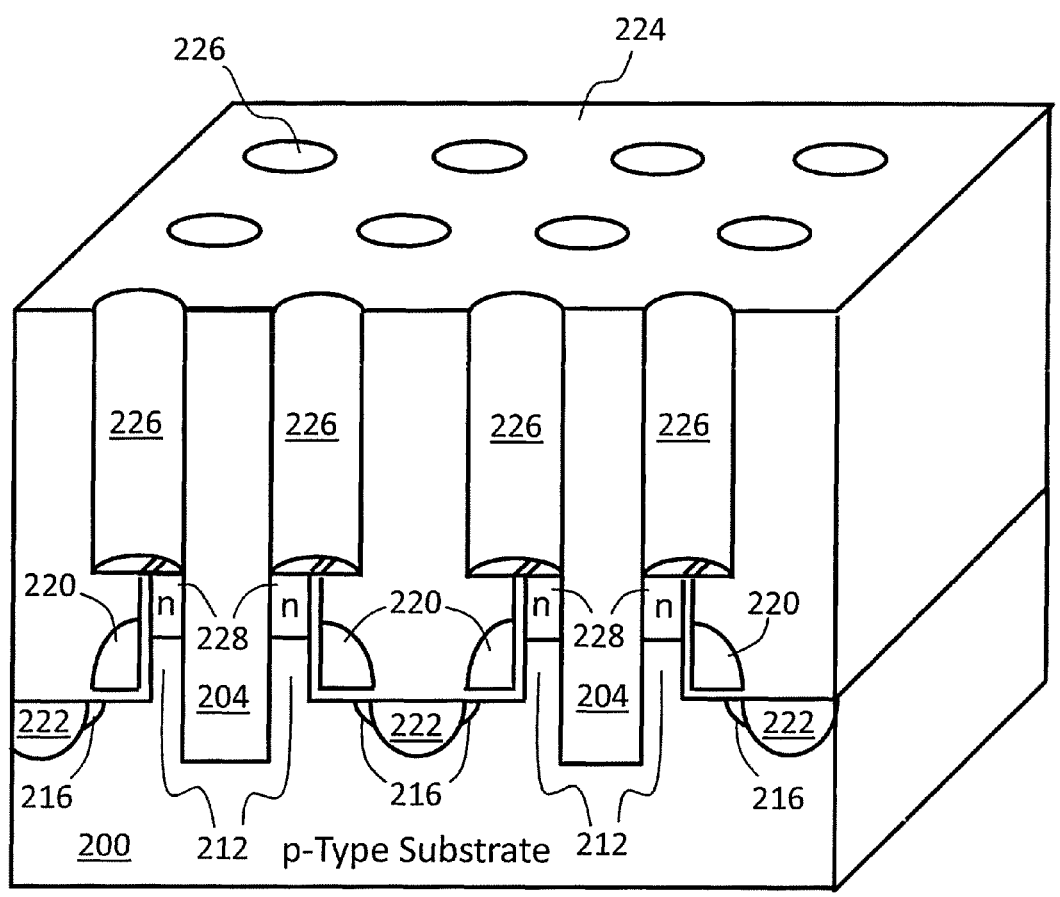

Referring now to FIG. 10, the processing continues by forming an interlayer dielectric (ILD) layer 224 over the trenches 208 and the trench isolation regions 204 to electrically insulate components and to provide a base for the fabrication of components above the current level. The formation of the ILD layer 224 comprises the steps of depositing a dielectric layer over the trenches 208 and the trench isolation regions 204 and planarizing the dielectric layer by a CMP process. The dielectric layer and the ILD layer 224 formed therefrom may comprise silicon oxide, silicon nitride, boron nitride, aluminum oxide, or any insulating material with a sufficiently low dielectric constant. After the formation of the ILD layer 224, a plurality of contact holes 226 aligned to the trench sidewalls 212 therebeneath are formed by vertical etching through the ILD layer 224. The vertical etching process may be carried out by using a conventional RIE process for contact hole. Following the formation of the contact holes 226, a plurality of drain regions 228 having the second type conductivity are formed in top portions of the trench sidewalls 212 by ion implantation through the contact holes 226. Accordingly, a row of the drain regions 228 formed on a respective one of the trench sidewalls 212 are separated by regions having the first type conductivity and share a common channel formed on the respective one of the trench sidewalls 212. In some embodiments where the substrate 200 has the p-type conductivity for forming selection transistors with the n-type channel, the drain regions 228 having the opposite n-type conductivity may be formed by ion implantation with any suitable dopant, such as phosphorous, arsenic, or antimony. In one embodiment, the contact holes 226 are arranged in a square array pattern with a pitch of 2 F along both the source line direction and the direction perpendicular thereto, resulting in the drain regions 228 having a cell size of 4 $F^2$.

Figure 11:
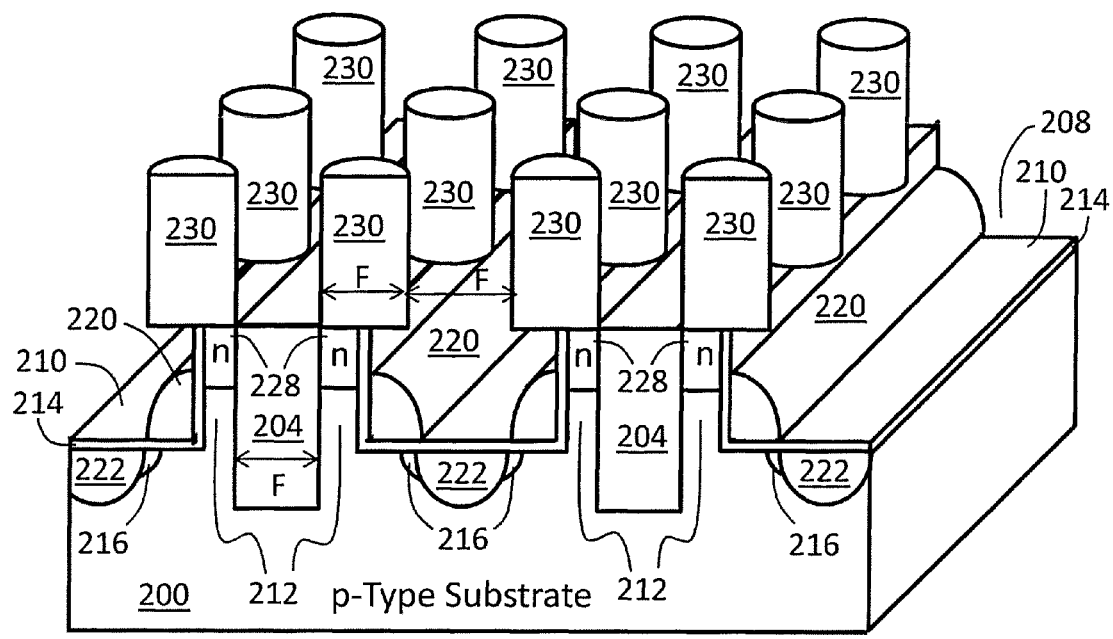

The processing continues by filling the contact holes 226 with a contact material and removing excess contact material from top of the ILD layer 224 to form a plurality of contact studs 230 disposed on top of the drain regions 228 as illustrated in FIG. 11. The ILD layer 224 is not shown in the figure for reasons of clarity. The contact material may be deposited by any suitable deposition method, such PVD, CVD, or ALD. The excess contact material on top of the ILD layer 224 may be removed by a CMP process. The contact material and the contact studs 230 formed therefrom may comprise one or more layers of any suitable conductive material, such as tungsten silicide ($WSi_x$), titanium silicide ($TiSi_x$), cobalt silicide ($CoSi_x$), nickel silicide ($NiSi_x$), tantalum nitride ($TaN_x$), titanium nitride ($TiN_x$), tantalum (Ta), tungsten (W), titanium (Ti), palladium (Pd), platinum silicide (PtSi), Indium (In), or combinations thereof.

Figure 12:
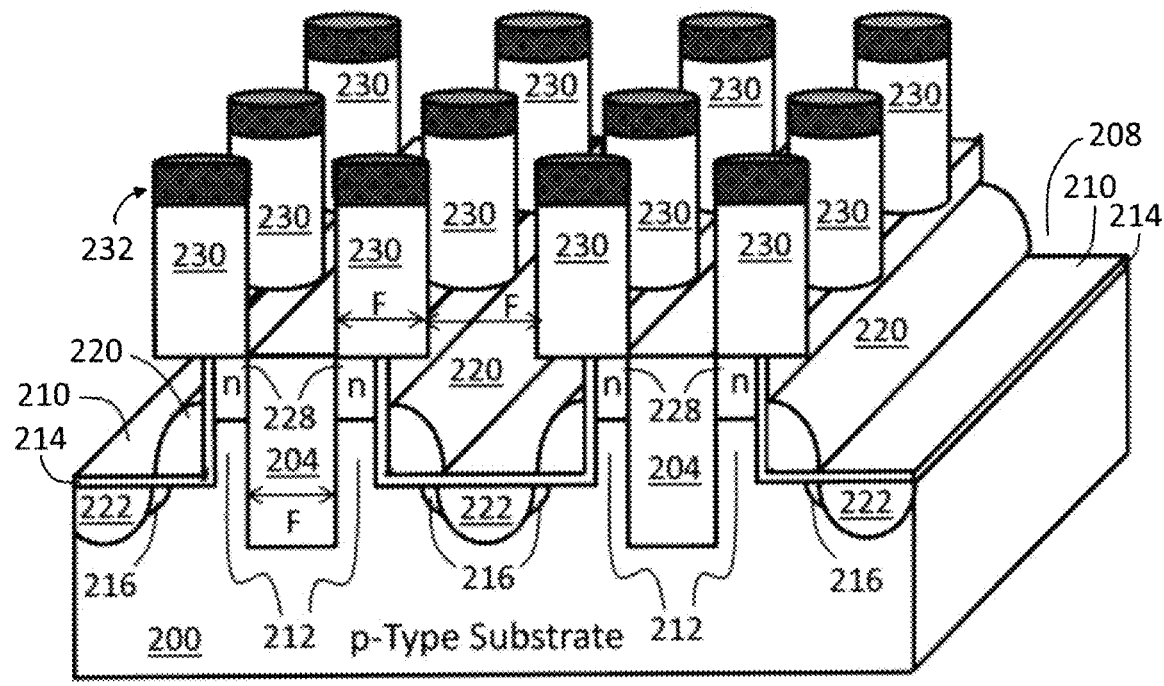

Referring now to FIG. 12, a plurality of memory elements 232 are formed on top of the contact studs 230 by first depositing a memory layer on top of the ILD layer (not shown for reasons of clarity) and then patterning the memory layer into the memory elements 232 in a manner as well known to one of skill in the art. The memory elements 232 may switch their resistance state by any suitable switching mechanism, such as phase change, precipitate bridging, magnetoresistive switching, or combinations thereof. In one embodiment, the memory elements 232 comprise a phase change chalcogenide compound, such as $Ge_2Sb_2Te_5$ or AgInSbTe, which can switch between a resistive amorphous phase and a conductive crystalline phase. In another embodiment, the resistive memory elements 232 comprise a nominally insulating metal oxide material, such as NiO, $TiO_2$, or $Sr(Zr)TiO_3$, which can switch to a lower electrical resistance state as the metal rich precipitates grow and link to form conductive paths upon application of an appropriate voltage. In yet another embodiment, the resistive memory elements 232 comprise at least two layers of ferromagnetic materials with a non-magnetic spacer layer interposed therebetween. When a switching pulse is applied, one of the ferromagnetic layers will switch its magnetic field polarity, thereby changing the electrical resistance of the memory element.

Figure 13:
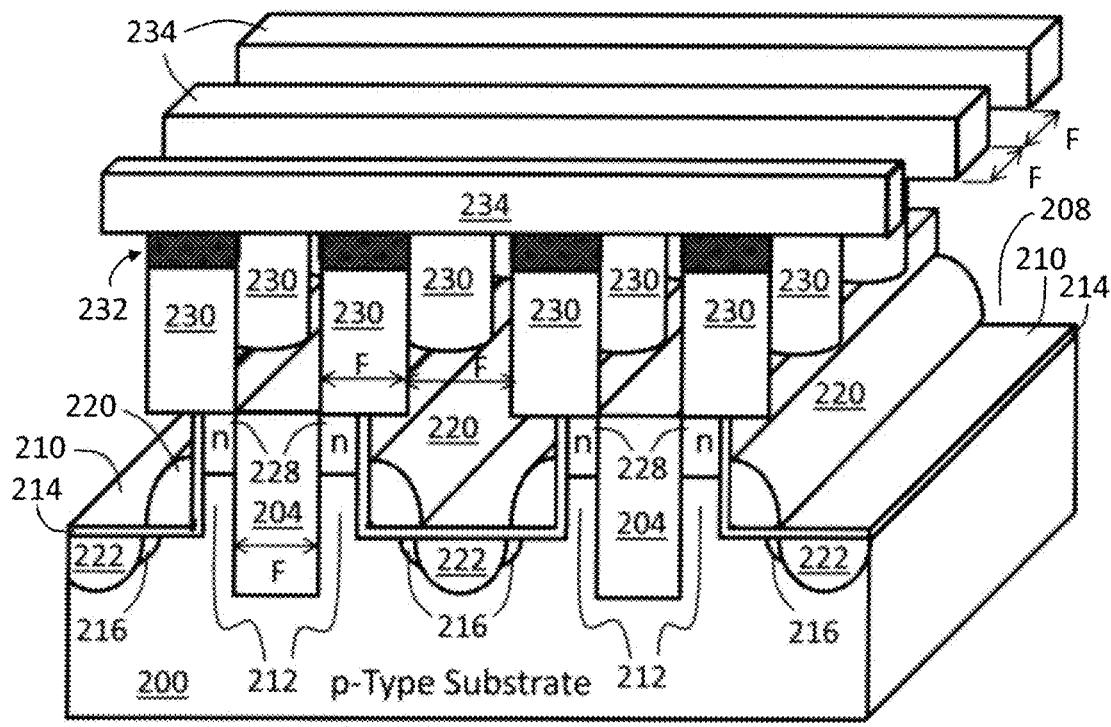

Referring now to FIG. 13, a plurality of parallel bit lines 234 connecting respective rows of the memory elements 232 in a direction perpendicular to the source lines 222 are formed on top of the memory elements 232. The bit lines 234 may be formed by first depositing a suitable conductor layer and then pattern the conductor layer into parallel lines. Alternatively, the bit lines 234 may be formed by a Damascene process in a manner as well known to one of skill in the art. The bit lines 234 may comprise any suitable conductive material, such as copper (Cu), tungsten (W), aluminum (Al), silver (Ag), or alloys thereof.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A memory device having a plurality of memory elements arranged in rows comprising:
   a semiconductor substrate having a first type conductivity and a plurality of parallel trenches separated by ridges that form sidewalls of said trenches therein, each of said trenches having a trench bottom and a pair of trench sidewalls;
   a plurality of parallel source lines having a second type conductivity opposite to said first type conductivity with one source line being formed in each trench bottom;
   a plurality of parallel gate electrodes formed on said trench sidewalls over a gate dielectric layer with each trench having a pair of gate electrodes disposed on opposite sides of said source line in said trench; and
   a plurality of drain regions having said second type conductivity formed in top regions of said ridges that form said trench sidewalls, each drain region being coupled to a resistive memory element with a row of said drain regions being formed adjacent to each of said trench sidewalls wherein each row of drain regions is coupled to a common channel that connects said row of drains to said one source line in said trench.

2. The memory device according to claim 1, wherein said semiconductor substrate comprises silicon.

3. The memory device according to claim 1, wherein said first type and second type conductivities are p type and n type conductivities, respectively.

4. The memory device according to claim 1, wherein said gate dielectric layer comprises silicon oxide.

5. The memory device according to claim 1, wherein said gate dielectric layer is formed of a compound comprising hafnium and oxygen.

6. The memory device according to claim 1, wherein said gate electrodes are formed of a material comprising doped polysilicon.

7. The memory device according to claim 1, wherein said gate electrodes comprises at least one layer formed of titanium nitride.

8. The memory device according to claim 1 further comprising:
   a plurality of contact studs disposed on top of said drain regions;
   a plurality of said resistive memory elements disposed on top of said contact studs; and
   a plurality of parallel bit lines disposed on top of said resistive memory elements, each of said bit lines connecting a respective row of said resistive memory elements along a direction perpendicular to said source lines.

9. The memory device according to claim 8, wherein said resistive memory elements are arranged in a square array with a pitch of 2 F.

10. The memory device according to claim 8, wherein said contact studs are made of a conducting material comprising tungsten.

11. The memory device according to claim 8, wherein said resistive memory elements comprise a phase change chalcogenide compound such as $Ge_2Sb_2Te_5$ or AgInSbTe.

12. The memory device according to claim 8, wherein said resistive memory elements comprise a precipitate bridging metal oxide such as NiO, $TiO_2$, $Sr(Zr)TiO_3$, or combinations thereof.

13. The memory device according to claim 8, wherein said resistive memory elements comprise at least two layers of ferromagnetic materials with a layer of non-magnetic spacer interposed therebetween.

14. A memory device comprising:
   a silicon semiconductor substrate having a p-type conductivity and a plurality of parallel trenches separated by ridges that form sidewalls of said trenches therein, each of said trenches having a trench bottom and a pair of trench sidewalls;

a plurality of parallel source lines having a n-type conductivity with each source line being formed in one of said trench bottoms;

a plurality of parallel gate electrodes with one gate electrode being formed on each of said trench sidewalls with a silicon oxide gate dielectric layer interposed therebetween, said gate electrodes comprising doped polysilicon and being lower in height than said trench sidewalls;

a plurality of drain regions having said n-type conductivity formed in top regions of said ridges forming said trench sidewalls, with each ridge having a row of drain regions with each of said drain regions being coupled to a memory element and the said row of drain regions sharing a common channel that extends along said gate dielectric layer adjacent to said gate electrode and connects said row of said drain regions to a respective one of said source lines;

a plurality of contact studs formed of tungsten disposed on top of said drain regions;

a plurality of resistive memory elements disposed on top of said contact studs, said resistive memory elements comprising at least two layers of ferromagnetic materials with a layer of non-magnetic spacer interposed therebetween; and a plurality of parallel bit lines disposed on top of said resistive memory elements, each of said bit lines connecting a respective row of said resistive memory elements along a direction perpendicular to said source lines.

15. A memory device having a plurality of memory elements arranged in an array of parallel rows comprising:

a semiconductor substrate having a plurality of parallel trenches separated by ridges that form sidewalls of said trenches;

each ridge having first and second parallel rows of drain regions formed respectively along opposite outer sides of said ridge, with each drain region being coupled to a corresponding memory element;

a source line formed in a bottom area of each trench;

a first gate electrode formed over a gate dielectric layer and disposed adjacent to said source line in each trench and adjacent to a first one of said ridges forming one of said one sidewalls of said trench; and a second gate electrode formed over a gate dielectric layer and disposed adjacent to said source line in each trench and adjacent to a second one of said ridges forming one of said one sidewalls of said trench;

wherein each of said first and second rows of drain regions is coupled to a common channel that extends along said gate dielectric layer adjacent to said respective gate electrode to said respective source line in said respective trench.

* * * * *